(12) United States Patent
Harada et al.

(10) Patent No.: US 9,668,362 B2
(45) Date of Patent: May 30, 2017

(54) MULTILAYER PRINTED CIRCUIT BOARD AND METHOD OF MANUFACTURING THE SAME

(71) Applicant: DENSO CORPORATION, Kariya, Aichi-pref (JP)

(72) Inventors: Toshikazu Harada, Kariya (JP); Yoshichika Ishikawa, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/466,611

(22) Filed: Aug. 22, 2014

(65) Prior Publication Data
US 2015/0060118 A1 Mar. 5, 2015

(30) Foreign Application Priority Data

Aug. 28, 2013 (JP) .................. 2013-176946

(51) Int. Cl.
*H05K 1/03* (2006.01)
*H05K 1/09* (2006.01)
(Continued)

(52) U.S. Cl.
CPC .......... *H05K 3/4617* (2013.01); *H05K 1/025* (2013.01); *H01L 2224/16225* (2013.01); *H05K 1/186* (2013.01); *H05K 3/4697* (2013.01)

(58) Field of Classification Search
CPC ......... H05K 3/4617; H05K 2201/0191; H05K 2201/0219; H05K 2201/09527;
(Continued)

(56) References Cited

U.S. PATENT DOCUMENTS 6,254,971 B1 * 7/2001 Katayose .............. H01L 23/142
174/258
6,700,789 B2 * 3/2004 Shirasaki ................ H01P 1/047
174/255
(Continued)

FOREIGN PATENT DOCUMENTS

JP 2003023222 A 1/2003
JP A-2003-8226 1/2003
(Continued)

OTHER PUBLICATIONS

Jun. 23, 2015 Office Action issued in Japanese Patent Application No. 2013-176946.

*Primary Examiner* — Chau N Nguyen
*Assistant Examiner* — Roshn Varghese
(74) *Attorney, Agent, or Firm* — Oliff PLC (57) ABSTRACT

When laminating two resin films so that sides where the conductive patterns are not formed face each other, and when laminating other resin films so that sides where the conductive patterns are formed and the sides where the conductive patterns are not formed to face each other, a plurality of resin films each of which has the same resin thickness are used for the other resin films, and two resin films having a sum of resin thickness that is the same as the resin thickness of the other single resin film are used for the two resin films. Accordingly, dielectric thicknesses between the conductive patterns formed in the adjoining resin films can be made even so that an impedance can be calculated easily, and it becomes possible to ease the circuit design.

1 Claim, 12 Drawing Sheets

(51) Int. Cl.
  *H05K 1/00* (2006.01)
  *H05K 3/46* (2006.01)
  *H05K 1/02* (2006.01)
  *H05K 1/18* (2006.01)

(58) Field of Classification Search
  CPC .......... H05K 2203/068; H05K 3/4632; H05K 2201/0129; H05K 1/025; H05K 1/186
  See application file for complete search history.

(56) References Cited

U.S. PATENT DOCUMENTS

| | | | |
|---|---|---|---|
| 7,688,594 B2* | 3/2010 | Muto | H05K 1/0219 174/254 |
| 2002/0076903 A1 | 6/2002 | Kondo et al. | |
| 2002/0079135 A1 | 6/2002 | Yazaki et al. | |
| 2002/0086145 A1 | 7/2002 | Yazaki et al. | |
| 2003/0155653 A1* | 8/2003 | Iijima | H05K 3/4038 257/758 |
| 2003/0209796 A1 | 11/2003 | Kondo et al. | |
| 2003/0222340 A1 | 12/2003 | Kondo et al. | |
| 2005/0186406 A1* | 8/2005 | Harada | H05K 1/0242 174/250 |
| 2006/0042078 A1* | 3/2006 | Takeuchi | H05K 1/186 29/830 |
| 2006/0068180 A1* | 3/2006 | Kondo | H05K 1/0269 428/209 |
| 2009/0032285 A1* | 2/2009 | Ueda | H05K 1/024 174/250 |
| 2011/0000706 A1 | 1/2011 | Shomura et al. | |
| 2011/0042124 A1* | 2/2011 | Matsui | H05K 1/0274 174/157 |
| 2011/0266033 A1* | 11/2011 | Tada | H05K 1/186 174/251 |
| 2014/0110155 A1* | 4/2014 | Otsubo | H05K 1/028 174/251 |

FOREIGN PATENT DOCUMENTS

| | | |
|---|---|---|
| JP | A-2003-86948 | 3/2003 |
| JP | A-2003-110243 | 4/2003 |
| JP | A-2003-209356 | 7/2003 |
| JP | A-2003-347748 | 12/2003 |
| JP | 2004119507 A | 4/2004 |
| JP | A-2006-210533 | 8/2006 |
| JP | A-2011-14847 | 1/2011 |

* cited by examiner

FIG.4
FIRST COMPARATIVE EXAMPLE

FIG.13 SECOND COMPARATIVE EXAMPLE

FIG.14 SECOND COMPARATIVE EXAMPLE

MULTILAYER PRINTED CIRCUIT BOARD AND METHOD OF MANUFACTURING THE SAME

CROSS-REFERENCE TO RELATED APPLICATION

This application is based on and claims the benefit of priority from earlier Japanese Patent Application No. 2013-176946 filed Aug. 28, 2013, the description of which is incorporated herein by reference.

TECHNICAL FIELD

The present disclosure relates to a multilayer printed circuit board and a method of manufacturing the same.

BACKGROUND

Conventionally as a manufacturing method of the multilayer printed circuit board that has conductive patterns formed on both sides, there is a method of laminating a plurality of resin films where the conductive patterns are formed only on one side thereof (refer to Japanese Patent Application Laid-Open Publication No. 2003-86948, for example).

In this manufacturing method, first, a plurality of resin films each of which has the same thickness are prepared.

Next, among the plurality of resin films, two arbitrary resin films are laminated so that the sides where the conductive patterns are not formed face each other.

Then, other remaining resin films are laminated so that the sides where the conductive patterns are formed and the sides where the conductive patterns are not formed face each other.

Then, the multilayer circuit board is manufactured by pressure heating the laminated resin films.

According to this manufacturing method, since only the resin film where the conductive patterns are formed on one side is used, a process of forming the conductive patterns on both sides of the resin film becomes unnecessary so that the manufacturing process of the multilayer printed circuit board can be simplified as compared with a case where both resin films where the conductive patterns are formed on one side and resin films where the conductive patterns are formed on both sides are used together.

Moreover, when using resin films each having different thickness, the resin films having each thickness must be manufactured separately. However, according to the manufacturing method mentioned above, since only the resin films each having a single thickness are manufactured, the manufacturing process of the multilayer printed circuit board can be simplified.

However, since the resin films each having the same thickness are laminated, the following problem arises in the multilayer printed circuit board after manufacturing in the above-mentioned conventional manufacturing method.

That is, when considering a thickness of dielectrics disposed between the conductive patterns of the adjoining resin films, a resin thickness of a single resin film equals the thickness of the dielectric in a portion where the other resin films are laminated.

On the other hand, a resin thickness of two resin films equals to the thickness of the dielectric in a portion where the two resin films are laminated.

Thus, since the thicknesses of the dielectrics differ in the portion where the above-mentioned two resin films are laminated and the portion where the other resin films are laminated, a formula for obtaining an impedance of the transmission line of the high-frequency signal may become complicated when forming the high frequency circuit in the multilayer printed circuit board.

For example, when the conductive patterns of the portion where the above-mentioned two resin films are laminated are used as the transmission line, as compared with a case where the conductive pattern of the portion where the other resin films are laminated is used, intervals between the transmission line and the conductive pattern positioned outside of the transmission line will differ.

For this reason, influences that the dielectric thicknesses between the transmission line and the conductive pattern in outer side of the transmission line have on the impedance differ.

Therefore, if the conductive patterns of the portion where the above-mentioned two resin films are laminated are used as the transmission line, the formula for calculating the impedance of the transmission line becomes complicated, and circuit design will be very complicated.

Moreover, when the conductive patterns on both sides of the multilayer printed circuit board are assigned to ground lines, and the conductive patterns inside the multilayer printed circuit board are used as the transmission lines of the high-frequency signal, intervals between the transmission lines and the ground lines will differ in one side and another side in a laminating direction when the number of the resin films that constitute the multilayer printed circuit board is an odd number.

That is, the transmission line becomes offset from a center of the laminating direction of the multilayer printed circuit board.

For this reason, the formula for calculating the impedance of the transmission line becomes complicated, and circuit design will be very complicated.

SUMMARY

An embodiment provides a multilayer printed circuit board that makes it possible to ease a circuit design considering impedances, and a method of manufacturing the multilayer printed circuit In a multilayer printed circuit board according to a first aspect, the multilayer printed circuit board includes a plurality of resin films and conductive patterns formed only on one side of each resin film.

Among the plurality of the resin films, two resin films are laminated so that sides where the conductive patterns are not formed face each other.

Other resin films among the plurality of the resin films except the previously-mentioned two resin films are laminated so that sides where the conductive patterns are formed and the sides where the conductive patterns are not formed face each other.

All intervals between the conductive patterns in a laminating direction in a portion where the other resin films are laminated are the same.

Intervals between the conductive patterns in the laminating direction in a portion where the two resin films are laminated are the same as the intervals in the portion where the other resin films are laminated.

In a method of manufacturing the multilayer printed circuit board according to a second aspect, the method includes a preparation process for preparing a plurality of resin films where conductive patterns are formed only on one side of each resin film, a lamination process for laminating the plurality of the resin films, and a pressure heating process for pressurizing while heating the laminated plurality of resin films.

Among the plurality of the resin films, two resin films are laminated in the lamination process so that sides where the conductive patterns are not formed face each other.

Other resin films among the plurality of the resin films except for these two resin films are laminated in the lamination process so that sides where the conductive patterns are formed and the sides where the conductive patterns are not formed face each other.

A plurality of resin films each of which has the same resin thickness are prepared for the other resin films in the preparation process, and two resin films having a sum of resin thickness that is the same as the resin thickness of the other single resin film are prepared for these two resin films in the preparation process.

According to the present disclosure, dielectric thicknesses between the conductive patterns formed in the adjoining resin films can be made even in a portion where the above-mentioned two resin films are laminated and a portion where the other resin films are laminated.

Thereby, when using the conductive patterns of the multilayer printed circuit board as the transmission line of the high-frequency signal, an impedance of the high-frequency signal line can be calculated easily, and it becomes possible to ease the circuit design.

For example, even if any of the conductive pattern formed in the plurality of the resin film are used as the transmission line of the high-frequency signal, it becomes possible to make even the dielectric thicknesses between the transmission line and the conductive pattern positioned in an outer side of the transmission lines in all of the transmission line that require impedance control.

As a result, the influences that dielectric thickness has on the impedance can be made equal in all the transmission lines that require impedance control.

Thereby, the impedances can be calculated easily.

Moreover, when the conductive patterns on both sides of the multilayer printed circuit board are assigned to ground lines, and the conductive patterns inside the multilayer printed circuit board are used as the transmission lines of the high-frequency signal, the transmission line can be positioned in a center of a laminating direction when the number of the resin films that constitute the multilayer printed circuit board is odd number.

Thereby, the impedances can be calculated easily.

DETAILED DESCRIPTION OF THE PREFERABLE EMBODIMENTS

With reference to the accompanying drawings, hereinafter will be described embodiments of the present disclosure.

It should be appreciated that, in the second embodiment and the subsequent embodiments, components identical with or similar to those in the first embodiment are given the same reference numerals, and structures and features thereof will not be described in order to avoid redundant explanation.

The First Embodiment

Figure 1:
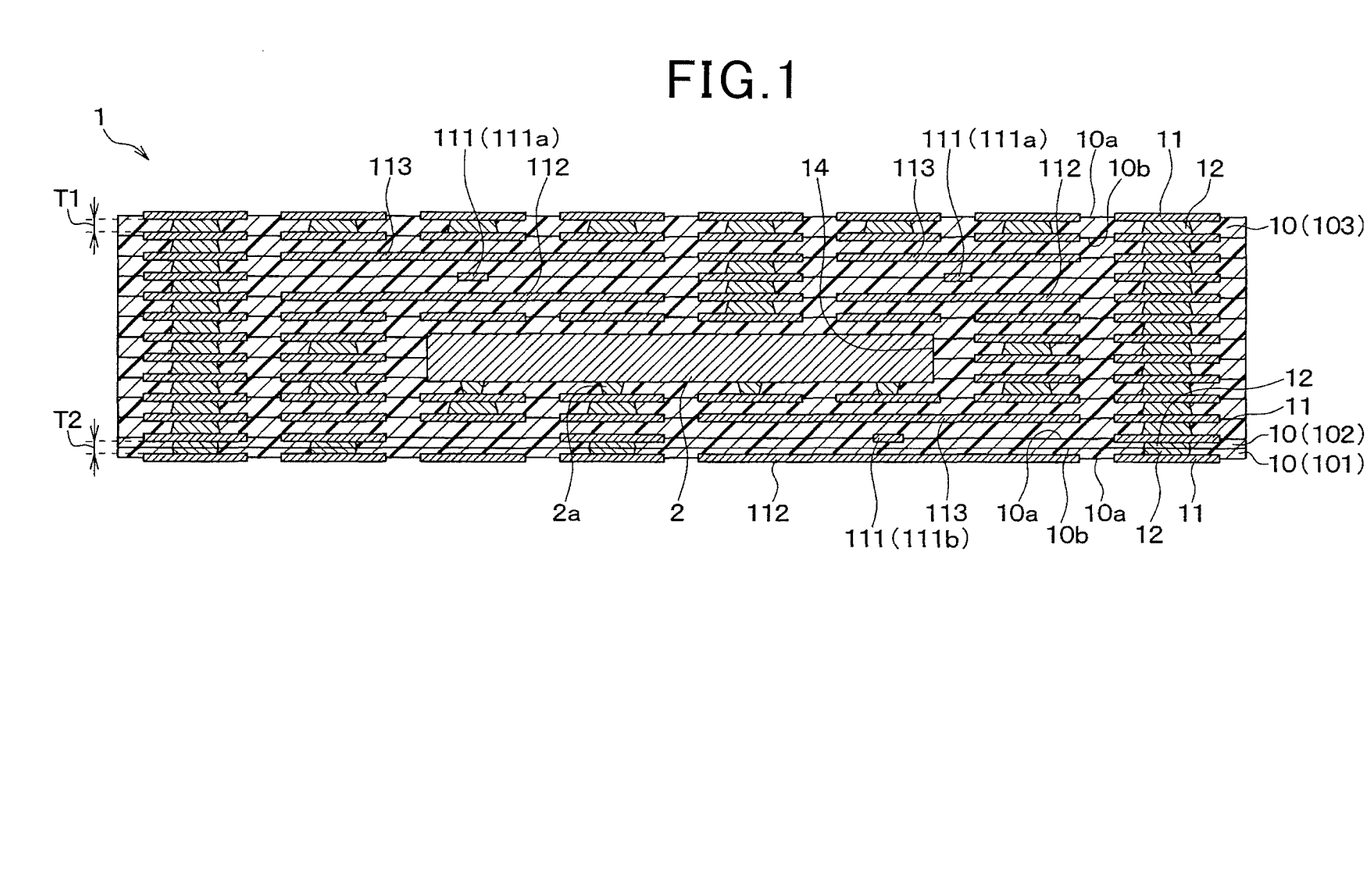
FIG. 1 shows a sectional view of a multilayer printed circuit board in a first embodiment.

As shown in FIG. 1, a multilayer printed circuit board (hereafter, simplified to the circuit board 1) of the present embodiment is a component-incorporated circuit board that has conductive patterns 11 on both sides thereof, while an active component 2 using a high-frequency signal is built in the circuit board 1.

This circuit board 1 has a structure of laminating a plurality of resin films 10 where the conductive patterns 11 are formed only on one side of each resin film 10.

Each resin film 10 is made of thermoplastic resin, and is adhered mutually. Each conductive pattern 11 is made of metallic foil, such as a copper foil. Vias 12 as interlayer connecting members are formed in each resin film 10. The laminated conductive patterns 11 are electrically connected by the vias 12. Each via 12 is formed by a sintered compact of metallic powder.

Among the plurality of the resin films 10, the two lowermost resin films 101, 102 are laminated so that sides 10b where the conductive patterns 11 are not formed face each other.

Further, the vias 12 formed in the two lowermost resin films 101, 102 are joined.

Other resin films 103 among the plurality of the resin films 10 except the two lowermost resin films are laminated so that the sides 10a where the conductive patterns 11 are formed and the sides 10b where the conductive patterns 11 are not formed face each other.

The active component 2 using the high-frequency signal is inserted in through holes 14 that other resin films 10 have. The active component 2 is an LSI (large scale integration) component, for example. A frequency band of the high-frequency signal used in the present specification is an electrical signal of 3 kHz or higher.

Lower electrodes 2a of the active component 2 are connected with the conductive patterns 11, and are electrically connected with transmission lines 111 of the high-frequency signal disposed inside the circuit board 1.

Each conductive pattern 11 formed on the plurality of sheets of the resin films 10 constitutes the transmission lines 111 and ground lines 112, 113 of the high-frequency signal.

In the present embodiment, one of the conductive patterns 11 formed on the two lowermost resin films 101, 102 is assigned to a transmission line 111b of the high-frequency signal that requires an impedance control.

Moreover, some of the conductive patterns 11 formed on other resin films 10 are assigned to transmission lines 111a of the high-frequency signal that require the impedance control.

The conductive patterns 11 above and below of each transmission lines 111a, 111b are assigned to the ground lines 112, 113.

In either of transmission line 111a, 111b, intervals between the transmission lines 111 and the conductive patterns 112, 113 positioned outside of the transmission lines 111 are equal.

Figure 2:
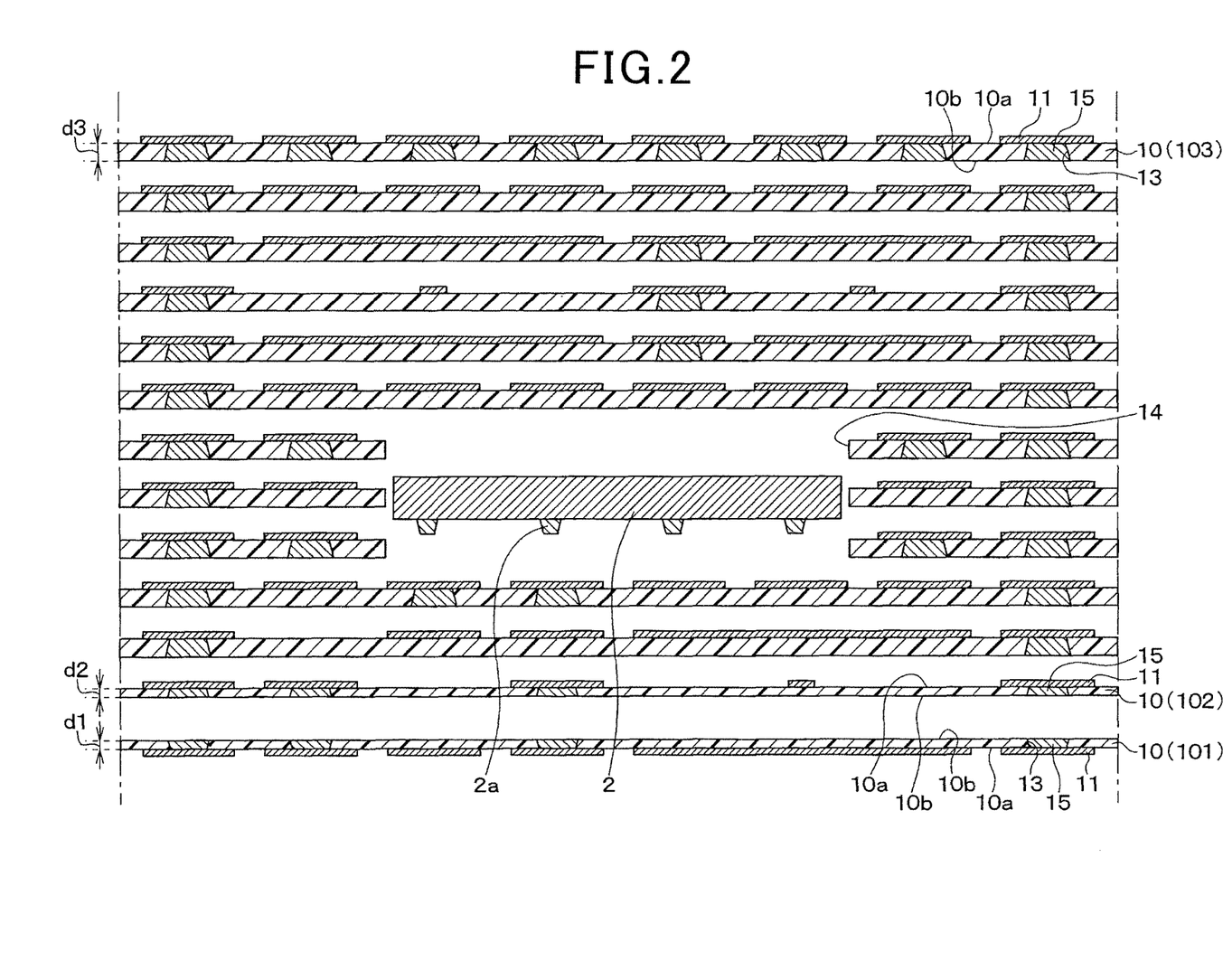
FIG. 2 shows a drawing for explaining a manufacturing method of the multilayer printed circuit board in the first embodiment.

Next, the manufacturing method of the circuit board 1 of the present embodiment is explained using FIG. 2.

In addition, FIG. 2 shows a laying order of the plurality of the resin films 10 before pressure heating.

First, a preparation process for preparing the plurality of resin films 10 where the conductive patterns 11 are formed only on one side of each resin film 10 is performed.

At this time, as shown in FIG. 2, a plurality of resin films each of which has the same resin thickness d3 are prepared for the other resin films 103 among the plurality of the resin films 10 except the two lowermost films.

On the other hand, two resin films having the sum of the resin thickness d1, d2 that is the same as the resin thickness d3 of the other single resin film 103 are prepared for the two lowermost resin films 101, 102.

Each resin thickness d1, d2 of the two lowermost resin films 101, 102 is set to a half of the resin thickness d3 of the other single resin films 103 in the present embodiment.

For example, the resin thickness d3 of the other single resin films 103 before pressure heating is set to 50 μm (micrometers), and each resin thickness d1, d2 of the two lowermost resin films 101, 102 is set to 25 μm.

Next, the metallic foil is disposed on one side of each resin film 10, and the conductive patterns 11 are formed by patterning the metallic foil.

Then, the via holes 13 are formed in each resin film 10 by laser beam machining.

At this time, the laser output is adjusted according to the thickness d1, d2 of the two lowermost resin films 101, 102, and the thickness d3 of other resin films 103.

Then, the via holes 13 are filled up with paste-like metallic powder 15 for via formation.

Moreover, the through holes 14 for inserting the active component 2 are formed in some of the other resin films 103 by laser beam machining.

Then, a lamination process for laminating the plurality of resin films 10 is performed.

At this time, as shown in FIG. 2, first, the two lowermost resin films 101, 102 are laminated so that the sides 10b where the conductive patterns 11 are not formed face each other.

Then, other resin films 103 among the plurality of the resin films 10 except the two lowermost films are laminated so that the sides 10a where the conductive patterns 11 are formed and the sides 10b where the conductive patterns 11 are not formed face each other.

In other words, the resin films 10 except for the lowermost resin film 101 are laminated with the sides 10a where the conductive patterns 11 are formed facing up, and the lowermost resin film 101 is flipped upside-down and laminated.

Moreover, the active component 2 is inserted in the through holes 14 when laminating the other resin films 103.

Then, a pressure heating process for pressurizing while heating the laminated plurality of resin films 10 is performed.

Thereby, resin films 10 are mutually adhered and unified, while resin flows in to fill gaps between the active component 2 and the resin films 10 and unified.

Moreover, the metallic powder 15 is sintered and the vias 12 are formed by the heat during the process.

Accordingly, the circuit board 1 shown in FIG. 1 is manufactured.

Figure 3:
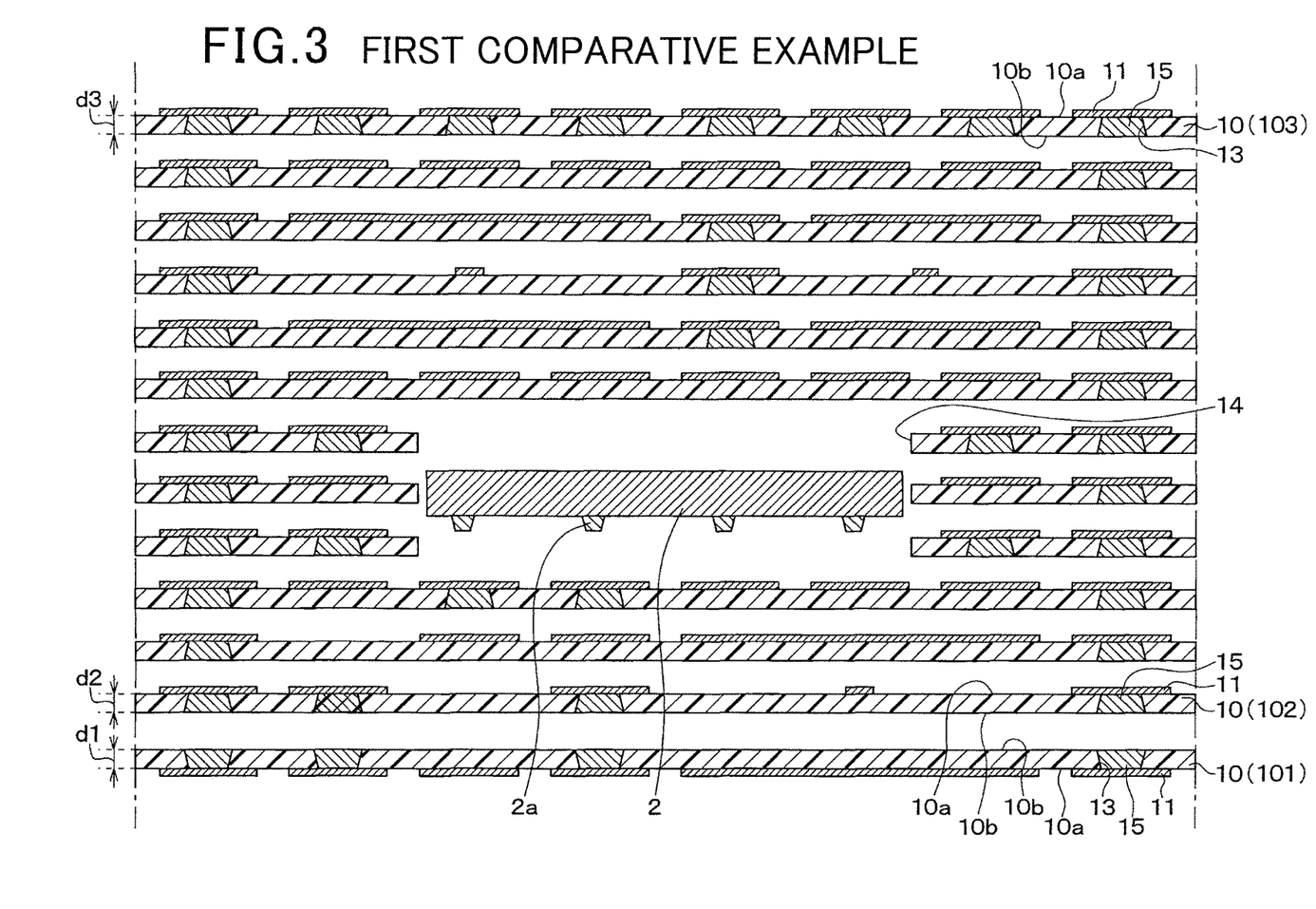
FIG. 3 shows a drawing for explaining the manufacturing method of the multilayer printed circuit board in a first comparative example.

Here, a manufacturing method of a multilayer printed circuit board and the multilayer printed circuit board after the manufacturing in a first comparative example are explained.

In the first comparative example, as shown in FIG. 3, respective thickness d1, d2 of two lowermost resin films 101, 102 are set the same as the thickness d3 of other resin films 10. That is, all the plurality of resin films 10 prepared are the same mutually. The rest of the composition is the same as that of the present embodiment.

Figure 4:
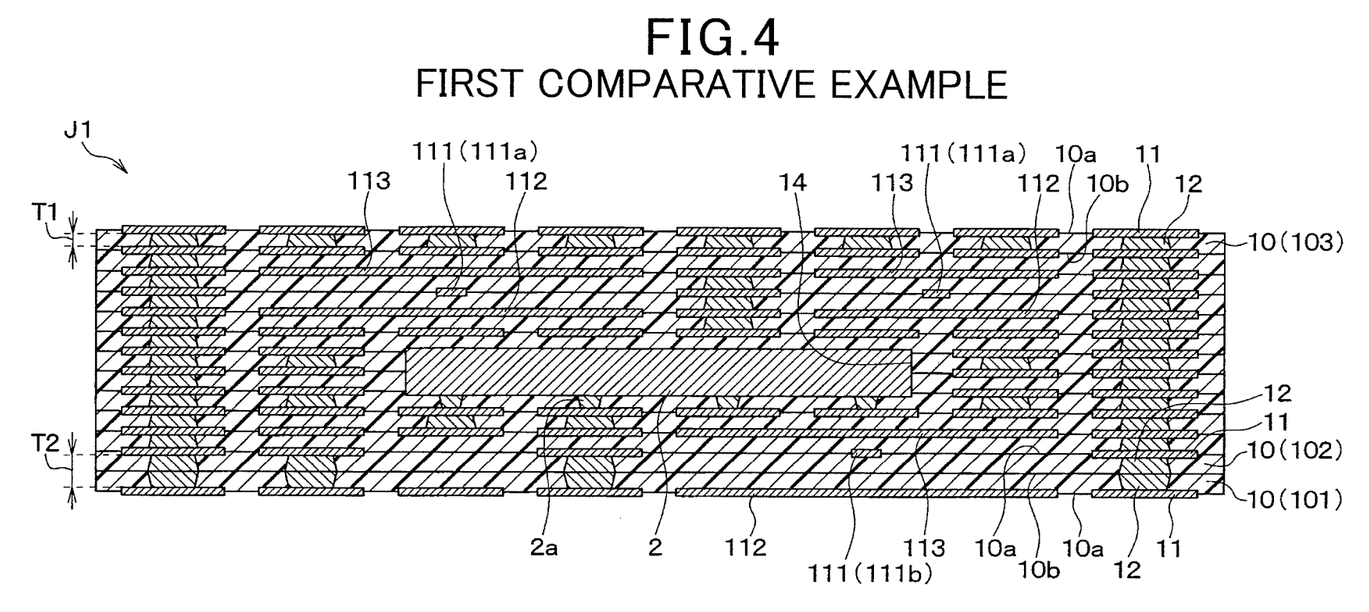
FIG. 4 shows a sectional view of the multilayer printed circuit board in the first comparative example.

In this case, as shown in FIG. 4, intervals between transmission lines 111 and conductive patterns 112, 113 positioned at an outer side thereof are different in a transmission line 111b that conductive patterns 11 formed on laminated portions of the two lowermost resin films 101, 102 constitute and transmission lines 111a that the conductive patterns 11 formed on lamination portions of the other resin films 103 constitute in the multilayer printed circuit board 31 after manufacturing.

Specifically, in the transmission line 111a, both intervals above and below the conductive pattern 11 positioned outside of the transmission line 111 are equal to a resin thickness T1 of the single resin film 10.

On the other hand, in the transmission line 111b, an interval between of the transmission line 111 and the conductive pattern 11 positioned above thereof is equal to the resin thickness T1 of the other signal resin film 103.

Then, an interval between the transmission line 111 and the conductive pattern 11 positioned below is equal a resin thickness T2 of two sheets of the resin films 10.

For this reason, in a portion where the two lowermost resin films 101, 102 are laminated, thickness of dielectrics positioned in both sides in a laminating direction of the transmission line 111b are different, and thickness of the dielectrics positioned in both sides in the laminating direction of the transmission line 111a differs as compared with portions where the other resin films 103 are laminated.

In other words, the transmission line 111 positioned between the ground lines 112, 113 is positioned in a center between the ground lines 112, 113 in a portion where the other resin films 103 are laminated.

However, the transmission line 111 positioned between the ground lines 112, 113 is positioned offset from the center between the ground lines 112, 113 in a portion where the two lowermost resin films 101, 102 are laminated.

Here, if the thickness of the dielectrics positioned in both sides in the laminating direction of the transmission line are the same, influences that the dielectric thickness has on impedance of the transmission line 111 of a high-frequency signal are equal, so that the impedance of the transmission line can be calculated using a general formula.

However, since the thickness of the dielectrics positioned in both sides in the laminating direction of the transmission line 111b differs in the portion where the two lowermost resin films 101, 102 are laminated, the influences that the dielectric thickness has on the impedance of the transmission line 111 will differ.

For this reason, a formula for calculating the impedance becomes complicated for the transmission line 111b that the conductive patterns 11 formed in the lamination portion of the two lowermost resin films 101, 102 constitutes, and a range of a degree of validity will be narrowed to a given accuracy.

Therefore, in the multilayer printed circuit board 31 of the first comparative example, a problem that the formula for calculating the impedance of the transmission line 111 becomes complicated will arise, and circuit design will be very complicated.

On the contrary, in the manufacturing method of the circuit board 1 of the present embodiment, first, the plurality of resin films having the same resin thickness d3 mutually are prepared for the other resin films 103 among the plurality of the resin films 10 except the two lowermost films Then, two resin films having the sum of the resin thickness d1, d2 that is the same as the resin thickness d3 of the other single resin film 103 are prepared for the two lowermost resin films 101, 102.

For this reason, when take a look at a cross section structure of the circuit board 1 after manufacturing, as shown in FIG. 1, intervals T1 and T2 of the conductive patterns 11 of the adjoining resin films 10 become equal in the portion where the two lowermost resin films 101, 102 are laminated and the portion where the other resin films 103 are laminated.

In other words, the thickness T1 and T2 of the dielectrics disposed between the conductive patterns 11 of the adjoining resin films 10 become equal.

Therefore, according to the present embodiment, even if both the conductive patterns 11 of the portion where the two lowermost resin films 101, 102 are laminated and the conductive patterns 11 of the portion where the other resin films 103 are laminated are used as the transmission line 111 of the high-frequency signal, the interval between the transmission line 111 and the conductive pattern 11 positioned outside of the transmission line 111 can be arranged with the resin thickness of the single sheet of the other resin film 10 in all the transmission lines 111 of the high-frequency signals.

As a result, the thickness of the dielectric disposed between the transmission line 111 and the conductive pattern 11 positioned outside of the transmission lines 111 can be made equal, and the influences that dielectric thickness has on the impedance can be made equal in all the transmission lines 111.

Thereby, the impedances can be calculated easily, and it becomes possible to ease the circuit design considering the impedances.

The Second Embodiment

The present embodiment has changed the thicknesses of the two lowermost resin films 101, 102 relative to those of the first embodiment.

Figure 5:
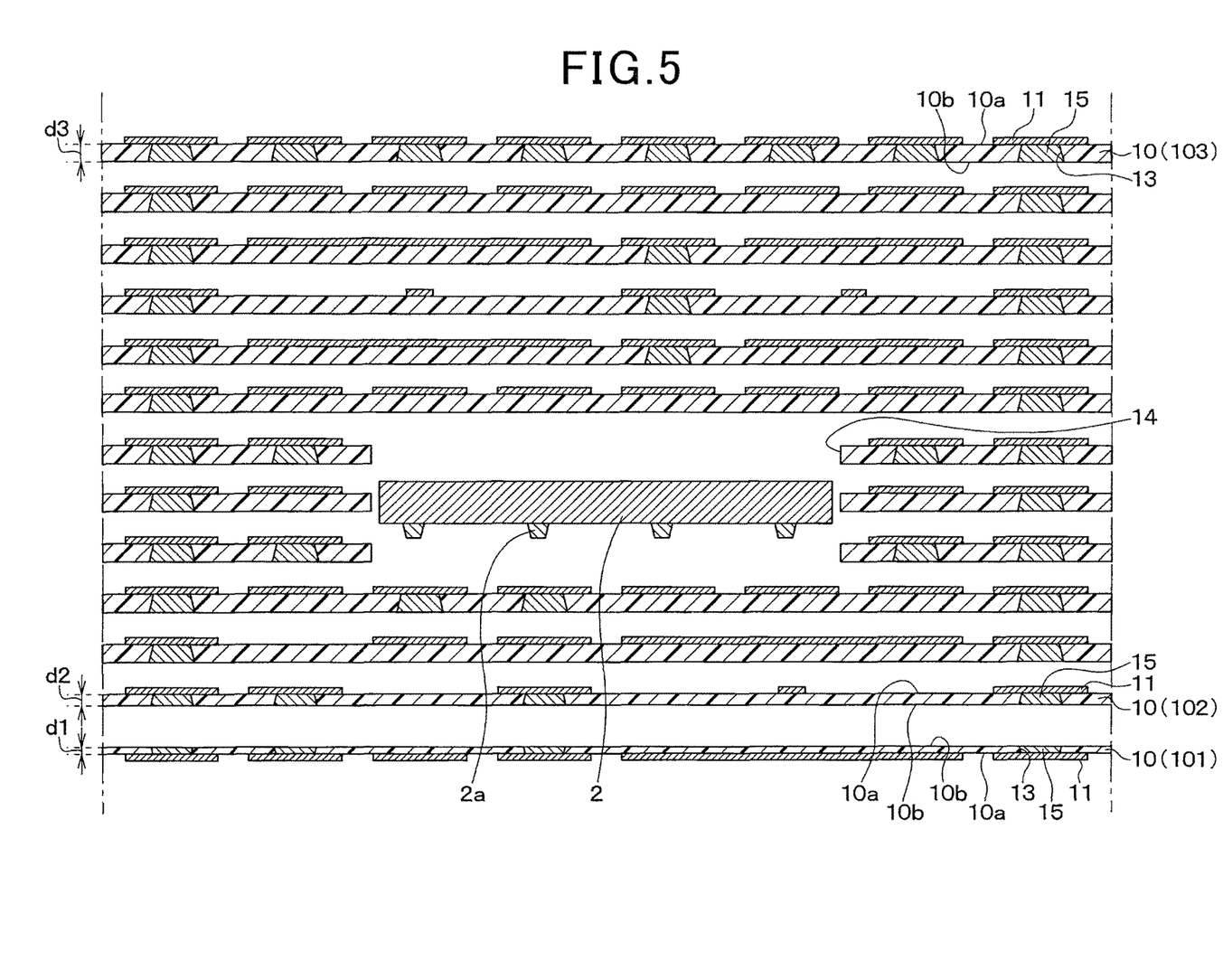
FIG. 5 shows a drawing for explaining the manufacturing method of the multilayer printed circuit board in a second embodiment.

In the present embodiment, as shown in FIG. 5, two resin films each having a different resin thickness d1, d2 while having the sum of the resin thickness d1, d2 that is the same as the resin thickness d3 of the other single resin film 103 are prepared for the two lowermost resin films 101, 102 in the preparation process of manufacturing the multilayer printed circuit board 1.

For example, the resin thickness d3 of the other single resin films 103 before pressure heating is set to 50 μm (micrometers), and each resin thickness d1, d2 of the two lowermost resin films 101, 102 is set to 20 ηm and 30 μm, respectively.

The rest is the same as the first embodiment.

Figure 6:
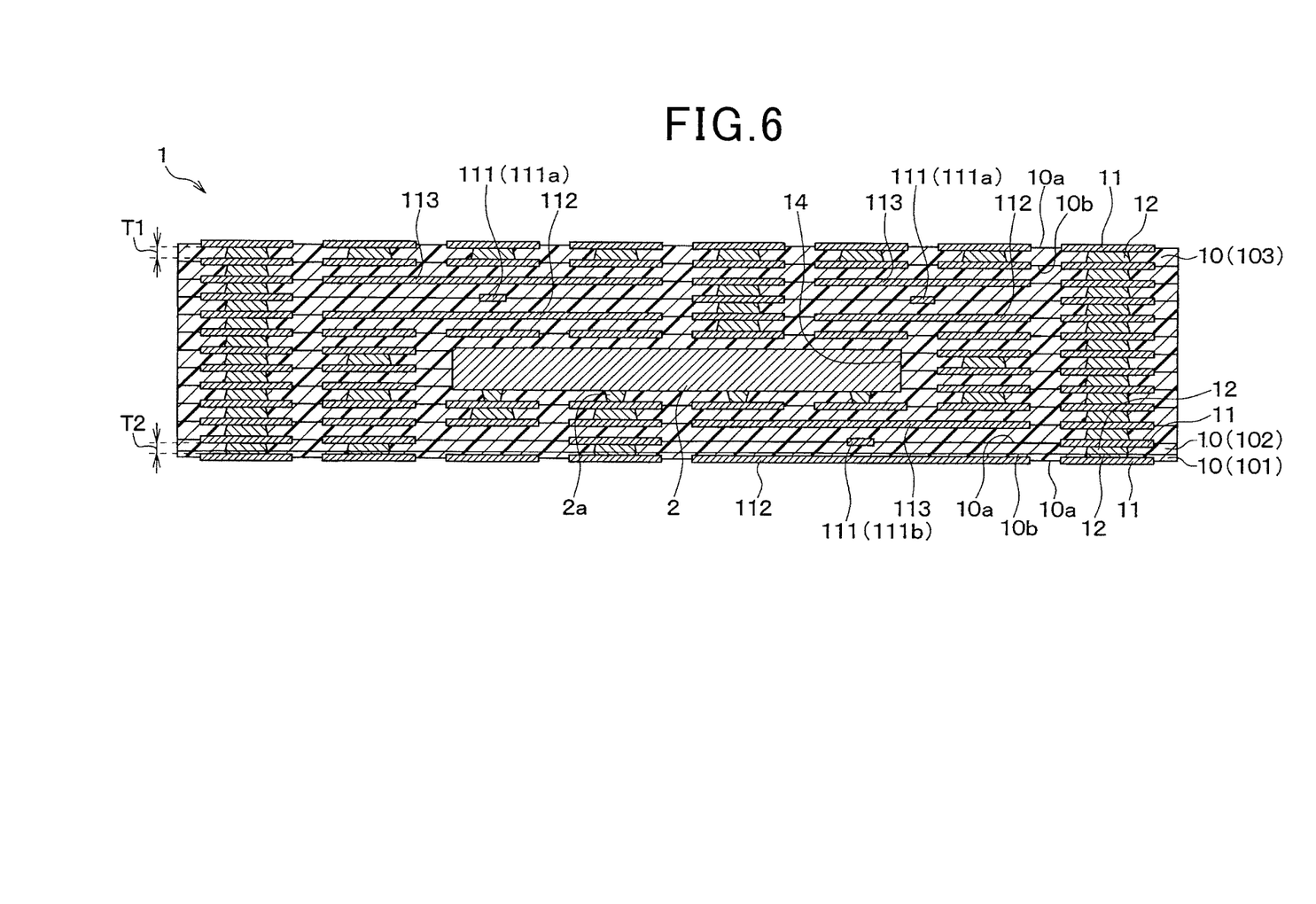
FIG. 6 shows a sectional view of the multilayer printed circuit board in the second embodiment.

Thereby, also in the present embodiment, as shown in FIG. 6, each resin thickness T1 of the other resin films 103 and the sum T2 of the resin thicknesses of the two lowermost resin films 101, 102 becomes the same as the resin thickness T1 of the single resin film 10 in the circuit board 1 after manufacturing.

Therefore, the same effect as the first embodiment can be obtained also by the present embodiment.

The Third Embodiment

The present embodiment has changed the positioning of the active component 2 relative to that of the first embodiment.

Figure 7:
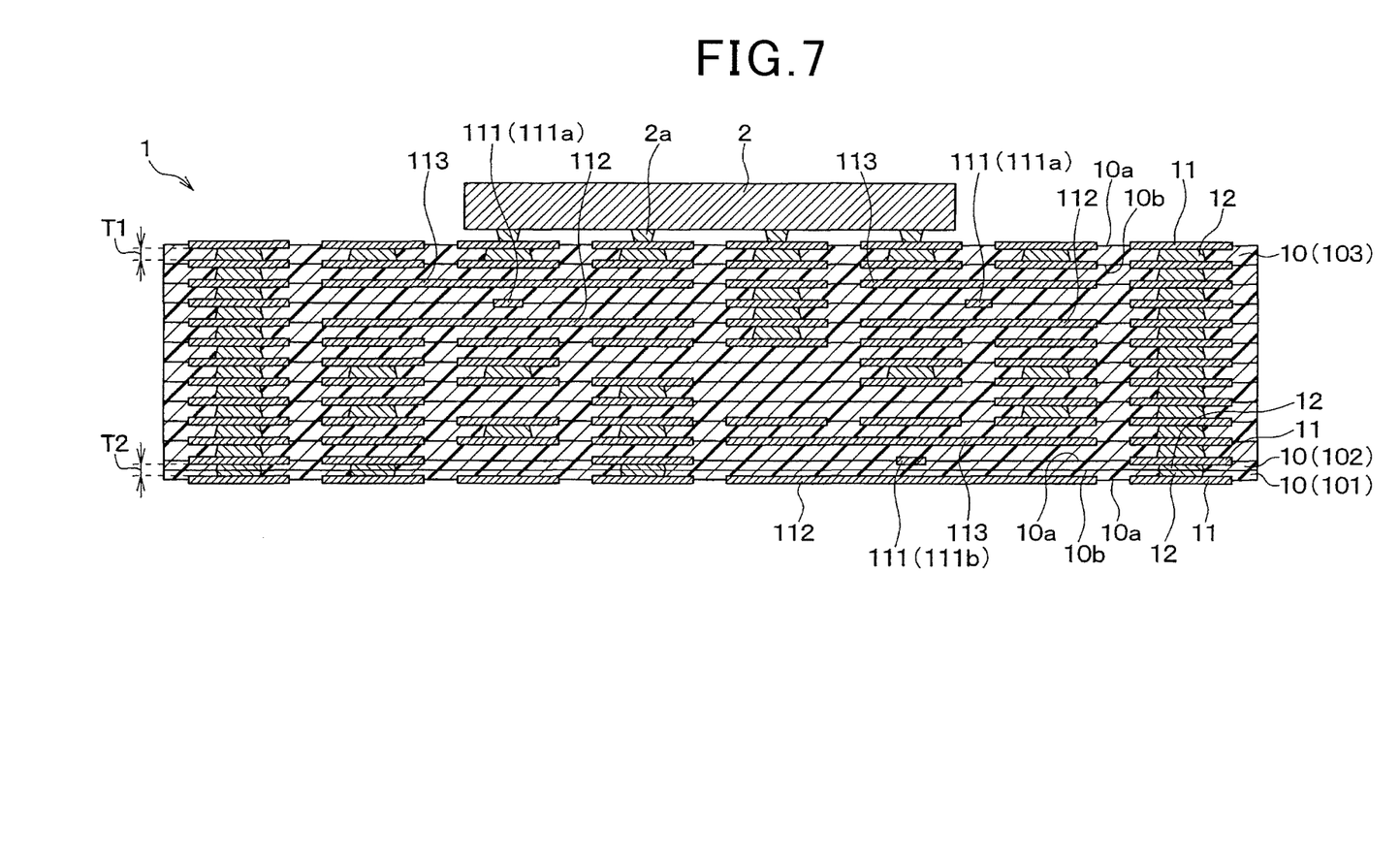
FIG. 7 shows a sectional view of the multilayer printed circuit board in a third embodiment.

That is, as shown in FIG. 7, the active component 2 is mounted on an outer surface of the circuit board in the circuit board 1 of the present embodiment.

The rest of the structures are the same as those of the first embodiment.

Figure 8:
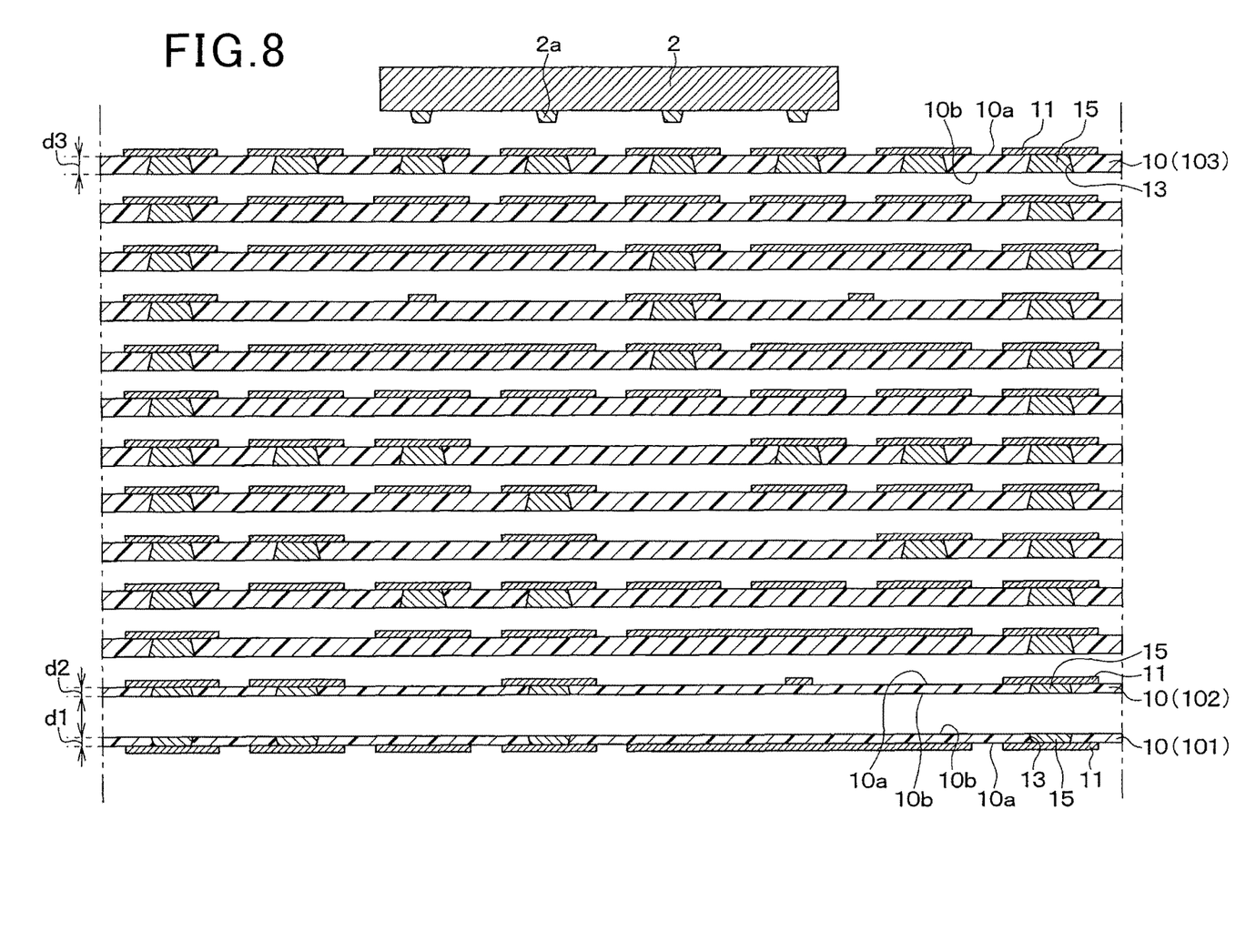
FIG. 8 shows a drawing for explaining the manufacturing method of the multilayer printed circuit board in the third embodiment.

This circuit board 1 is manufactured by changing the manufacturing method explained in the first embodiment to position the active component 2 on the outer surface of the circuit board, as shown in FIG. 8.

Specifically, the lower electrodes 2a of the active component 2 are connected to the conductive patterns 11 of the outer surface of the circuit board by soldering etc. after manufacturing the circuit board 1.

In the present embodiment, since the structure of the circuit board 1 is the same as that of the first embodiment except for the positioning of the active component 2, the same effects as the first embodiment can also be obtained.

The Fourth Embodiment

The present embodiment is a combination of the second and third embodiments.

Figure 9:
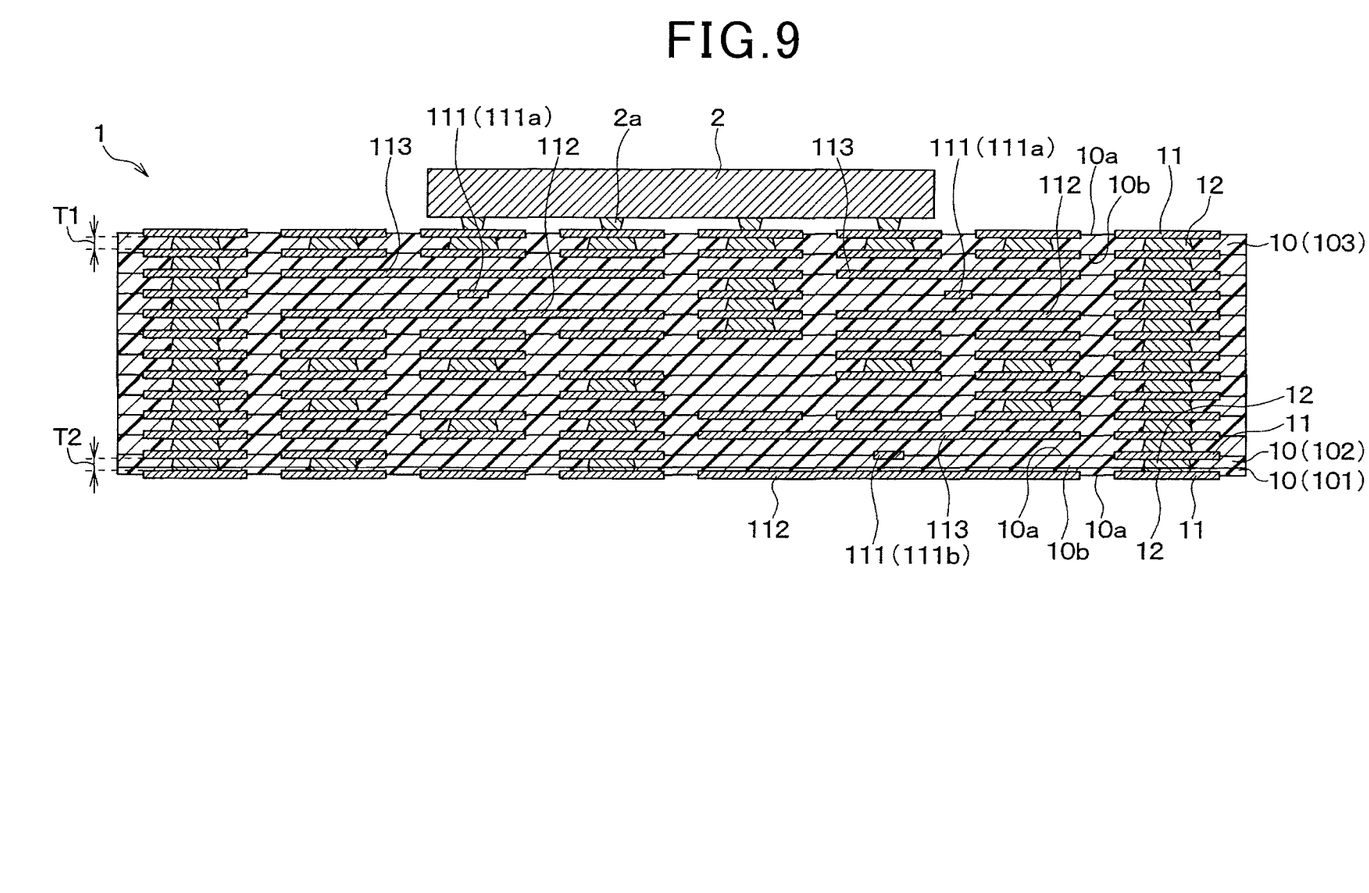
FIG. 9 shows a sectional view of the multilayer printed circuit board in the fourth embodiment.

That is, as shown in FIG. 9, the active component 2 is mounted on an outer surface of the circuit board in the circuit board 1 of the present embodiment.

Figure 10:
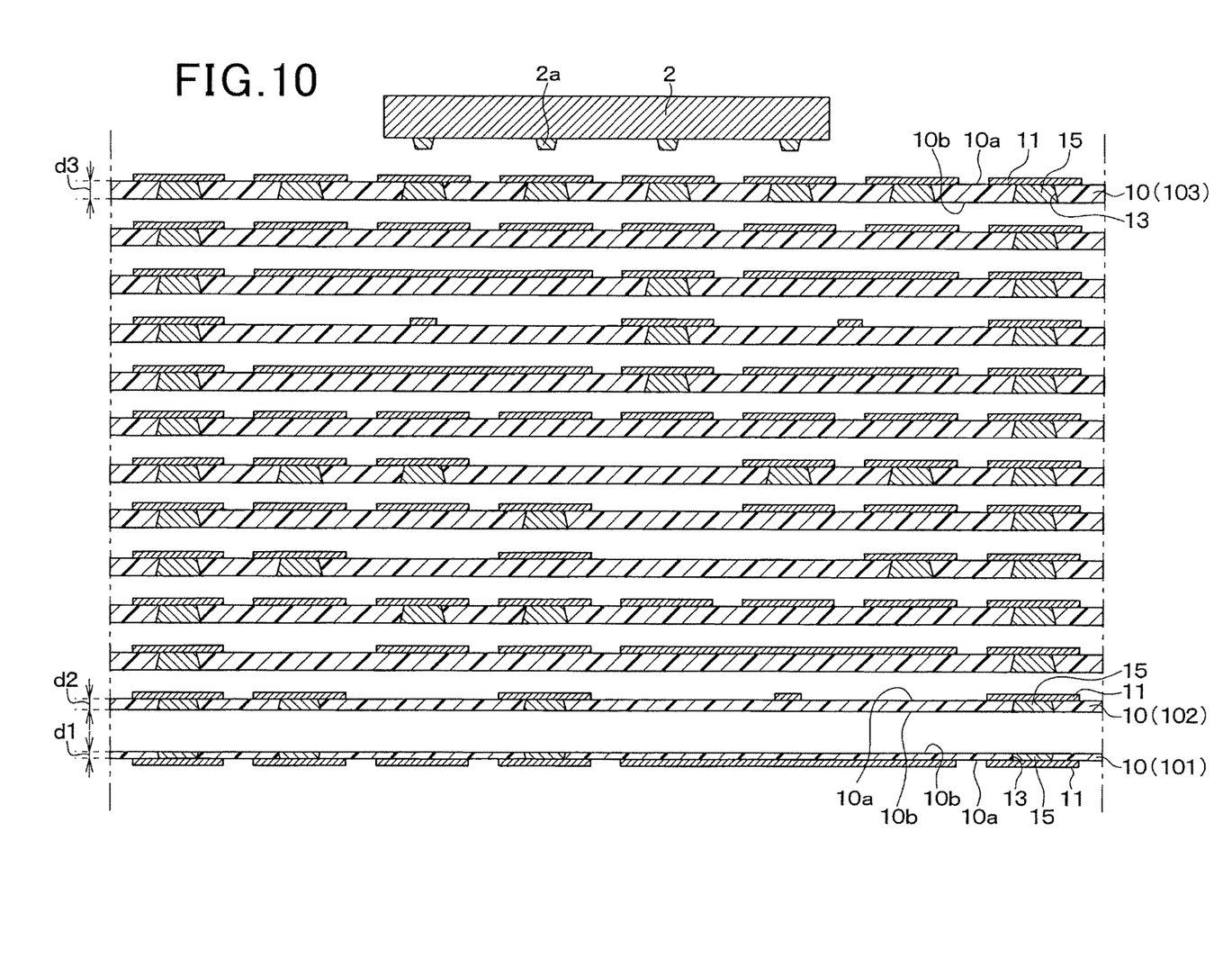
FIG. 10 shows a drawing for explaining the manufacturing method of the multilayer printed circuit board in the fourth embodiment.

Furthermore, as shown in FIG. 10, two resin films each having a different resin thickness d1, d2 while having the sum of the resin thickness d1, d2 that is the same as the resin thickness d3 of the other single resin film 103 are prepared for the two lowermost resin films 101, 102 in the preparation process of manufacturing the multilayer printed circuit board 1.

For this reason, the structure of the circuit board 1 is the same as that of the second embodiment except for the positioning of the active component 2 in the circuit board 1 of the present embodiment Therefore, the same effect as the first embodiment can also be obtained by the present embodiment.

The Fifth Embodiment

Figure 11:
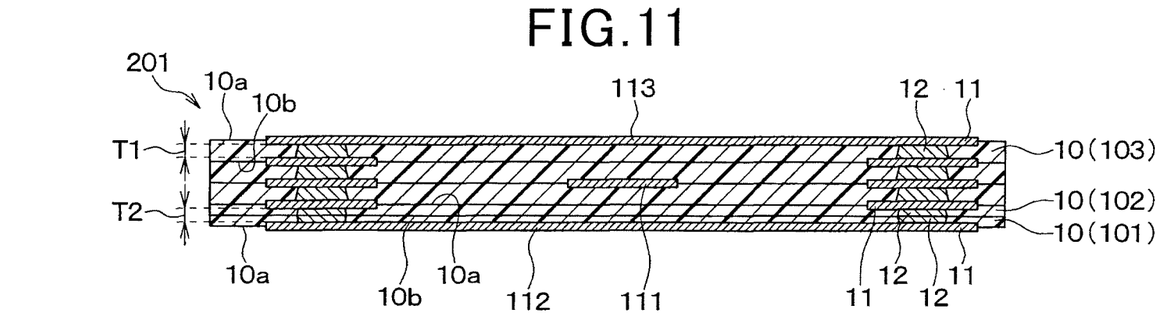
FIG. 11 shows a sectional view of the multilayer printed circuit board in a fifth embodiment.

As shown in FIG. 11, a multilayer printed circuit board 201 of the present embodiment has conductive patterns 11 on both sides thereof, and is used as a cable for transmitting a high-frequency signal.

This multilayer printed circuit board 201 has a structure similar to that of the first embodiment that a plurality of resin films 10 in which the conductive pattern 11 are formed only on one side are laminated.

The conductive patterns 11 formed on the both sides of the multilayer printed circuit board 201 constitute ground lines 112, 113, and the conductive patterns 11 positioned in a center in a laminating direction of the multilayer printed circuit board 201 constitutes a transmission line 111 of a high-frequency signal.

Specifically, there are five sheets of the resin film 10 are laminated in the multilayer printed circuit board 201.

The two lowermost resin films 101, 102 are laminated so that sides 10b where the conductive patterns 11 are not formed face each other.

Other resin films 103 except the two lowermost films are laminated so that the sides 10a where the conductive patterns 11 are formed and the sides 10b where the conductive patterns 11 are not formed face each other.

One of the conductive patterns 11 formed on the other resin films 103 of a third sheet from the bottom is assigned to a transmission line 111 of the high-frequency signal.

In addition, ground lines 112, 113 are electrically connected through the vias 12 formed in each resin film 10.

Figure 12:
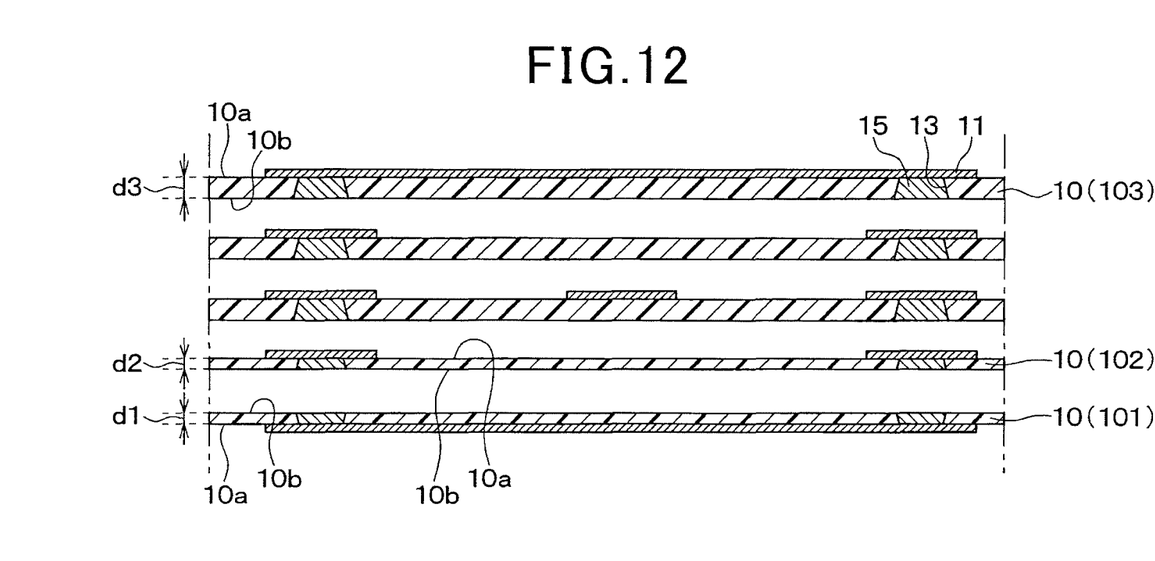
FIG. 12 shows a drawing for explaining the manufacturing method of the multilayer printed circuit board in the fifth embodiment.

The multilayer printed circuit board 201 of such a structure is manufactured by the same manufacturing method as that of the first embodiment, as shown in FIG. 12.

That is, also in the present embodiment, two resin films having the sum of the resin thickness d1, d2 that is the same as the resin thickness d3 of the other resin film 103 are prepared for the two lowermost resin films 101, 102.

At this time, each resin thickness d1, d2 of the two lowermost resin films 101, 102 may be set to a half of the resin thickness d3 of the other single resin films 103, or may be different thicknesses.

Figure 13:
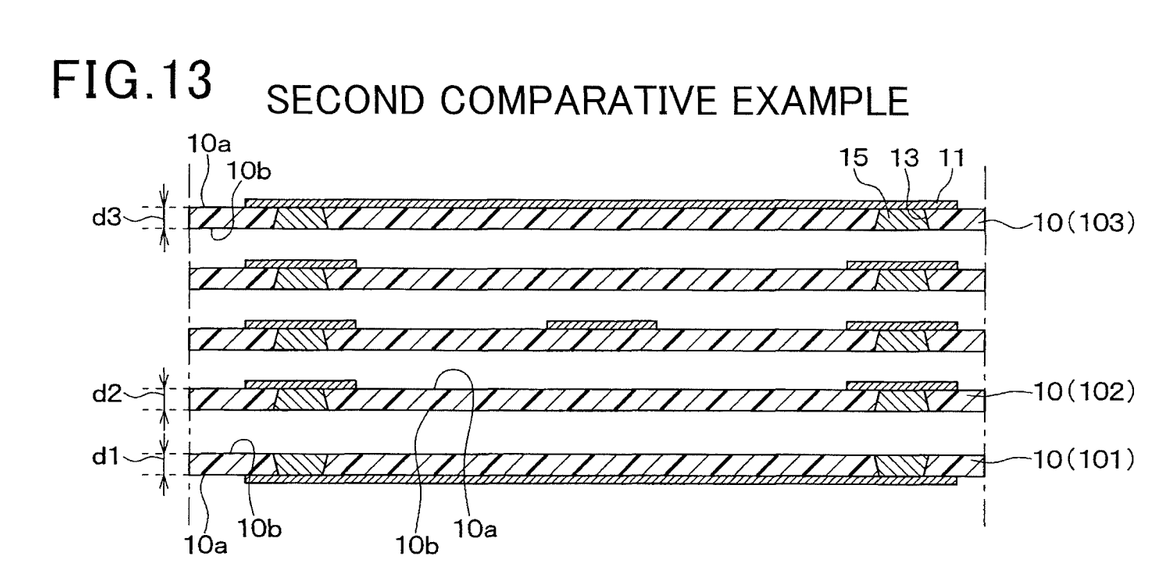
FIG. 13 shows a drawing for explaining the manufacturing method of the multilayer printed circuit board in a second comparative example.

Here, a manufacturing method of a multilayer printed circuit board and the multilayer printed circuit board after the manufacturing in a second comparative example are explained.

In the second comparative example, as shown in FIG. 13, respective thickness d1, d2 of two lowermost resin films 101, 102 are set the same as the thickness d3 of other resin films 10. That is, all the plurality of resin films 10 prepared are the same. The rest of the composition is the same as that of the present embodiment.

Figure 14:
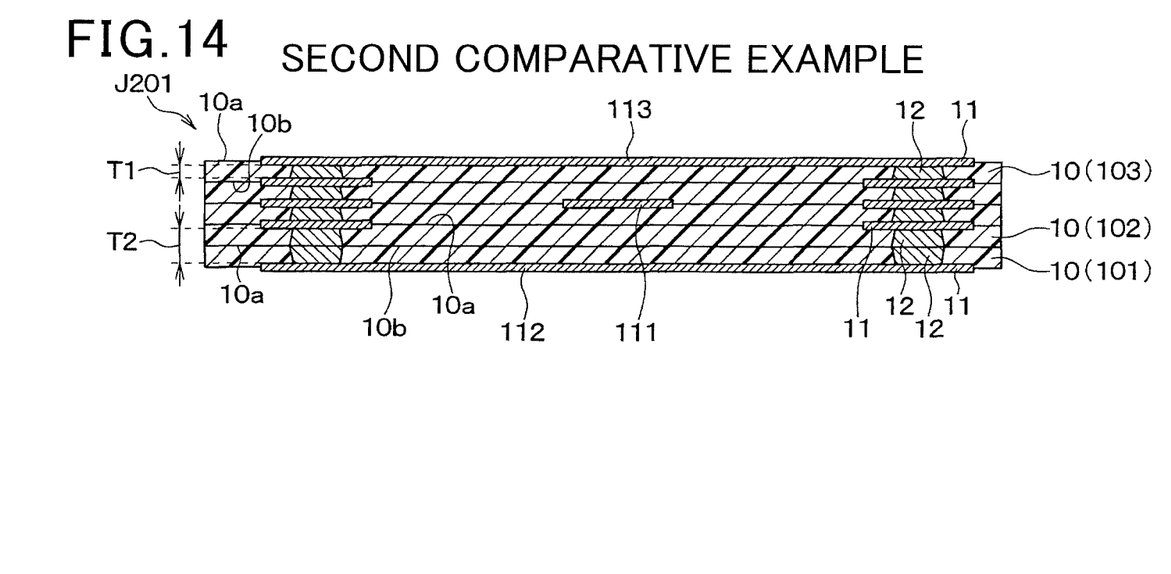
FIG. 14 shows a sectional view of the multilayer printed circuit board in the second comparative example.

In this case, as shown in FIG. 14, since odd number of sheets of the resin films 10 is laminated, intervals between a transmission line 111 and the ground lines 112, 113 positioned outside of the transmission lines 111 are different in one side and in another side in a laminating direction in the multilayer printed circuit board J201 after manufacturing.

That is, the transmission line 111 of the high-frequency signal becomes offset from a center of the laminating direction of the multilayer printed circuit board J201.

For this reason, in the multilayer printed circuit board J201, a formula for calculating the impedance becomes complicated for the transmission line, and a range of operating parameters will be narrowed.

Therefore, in the multilayer printed circuit board J201 of the second comparative example, a problem that the formula for calculating the impedance of the transmission line 111 becomes complicated will arise, and circuit design will be very complicated.

On the contrary, the manufacturing method of the circuit board 201 of the present embodiment as well as the first embodiment, a plurality of resin films each of which has the same resin thickness d3 are prepared for the other resin films 103, and two resin films having the sum of the resin thickness d1, d2 that is the same as the resin thickness d3 of the other resin film 103 are prepared for the two lowermost resin films 101, 102.

For this reason, when take a look at a cross section structure of the circuit board 201 after manufacturing, as shown in FIG. 11, intervals T1 and T2 of the conductive patterns 11 of the adjoining resin films 10 become equal in the portion where the two lowermost resin films 101, 102 are laminated and the portion where the other resin films 103 are laminated.

In other words, the thickness T1 and T2 of the dielectrics between the conductive patterns 11 of the adjoining resin films 10 become equal.

Accordingly, when considering the number of sheets of the resin film 10 laminated that constitutes the multilayer printed circuit board 201 to be odd number, the interval of the transmission line 111 and the ground lines 112, 113 positioned outside of the transmission lines 111 can be made equal.

That is, the transmission line 111 of the high-frequency signal can be disposed in the center in the laminating direction of the multilayer printed circuit board J201.

Thereby, the impedances can be calculated easily, and it becomes possible to ease the circuit design considering the impedances.

Other Embodiments

The present disclosure is not limited to the above-mentioned embodiments, and can be suitably altered without departing from the scope of the present disclosure.

(1) In each above-mentioned embodiment, although the two resin films 101, 102 are disposed at the lowermost part of the multilayer printed circuit boards 1, 201, the two resin films 101, 102 may be disposed in other than the lowermost part such as in the center of the multilayer printed circuit boards 1, 201.

(2) Although the composition that the ground lines 112, 113 are disposed above and below of the transmission line 111 is adopted in the first to fourth embodiments, the present disclosure is not limited to this composition.

When the transmission line 111 of the high-frequency signal is constituted by the conductive patterns 11 on the surface of the multilayer printed circuit board, a ground line will be disposed only on one side in the vertical direction.

(3) Although all of the plurality of resin films 10 is made of thermoplastic resin in the embodiments mentioned above, all of the plurality of resin films 10 may be made of thermosetting resin.

Moreover, resin films made of thermoplastic resin may be used together with resin films made of thermosetting resin as the plurality of resin films 10.

(4) Each of the above-mentioned embodiments is not mutually unrelated, and may be combined suitably except for the case of being clearly improper.

Moreover, in each of the above-mentioned embodiments, the elements that constitute the embodiment are not necessarily indispensable except for a case where it is clearly described that the element are indispensable, or a case where it is clearly described that the element are indispensable theoretically.

What is claimed is:

1. A multilayer printed circuit board comprising: a plurality of resin films laminated in a lamination direction, each resin film having a via, the plurality of resin films having a top surface and a bottom surface; and conductive patterns formed only on one side of each resin film, the conductive patterns including a first conductive pattern at the top surface, a second conductive pattern at the bottom surface, and a third conductive pattern at a center of the plurality of resin film in the lamination direction, the third conductive pattern constituting a transmission line of a high-frequency signal of 3 kHz or higher, the first conductive pattern and the second conductive pattern being connected through the vias in the resin films and constituting ground lines of the high-frequency signal, wherein, among the plurality of the resin films, two resin films are laminated so that sides where the conductive patterns are not formed face each other; other resin films among the plurality of the resin films except for these two resin films have a same resin thickness and are laminated so that sides where the conductive patterns are formed and the sides where the conductive patterns are not formed face each other; all intervals between the conductive patterns in a laminating direction in a portion where the other resin films are laminated are the same; and intervals between the conductive patterns in the laminating direction in a portion where the two resin films are laminated are the same as the intervals in the portion where the other resin films are laminated by configuring the two resin films to have a sum of their thickness to be the same as the resin thickness of any single one of the other resin films.

\* \* \* \* \*